US009550895B2

(12) United States Patent
Schrauwen

(10) Patent No.: US 9,550,895 B2
(45) Date of Patent: Jan. 24, 2017

(54) THERMOPLASTIC COMPOSITION

(71) Applicant: MITSUBISHI CHEMICAL EUROPE GMBH, Düsseldorf (DE)

(72) Inventor: Bernardus Antonius Gerardus Schrauwen, Leende (NL)

(73) Assignee: MITSUBISHI CHEMICAL EUROPE GMBH, Düsseldorf (DE)

( * ) Notice: Subject to any disclaimer, the term of this patent is extended or adjusted under 35 U.S.C. 154(b) by 0 days.

(21) Appl. No.: 14/651,743

(22) PCT Filed: Dec. 13, 2013

(86) PCT No.: PCT/EP2013/076576
§ 371 (c)(1),
(2) Date: Jun. 12, 2015

(87) PCT Pub. No.: WO2014/095648
PCT Pub. Date: Jun. 26, 2014

(65) Prior Publication Data
US 2015/0315382 A1    Nov. 5, 2015

(30) Foreign Application Priority Data

Dec. 18, 2012 (EP) .................... 12197724

(51) Int. Cl.
*C08L 69/00* (2006.01)
*H05K 1/03* (2006.01)
*H05K 3/00* (2006.01)
*C08K 3/20* (2006.01)
*C08G 64/04* (2006.01)
*C08G 64/18* (2006.01)
*C08G 77/448* (2006.01)

(52) U.S. Cl.
CPC ............. *C08L 69/00* (2013.01); *C08G 64/04* (2013.01); *C08G 64/18* (2013.01); *C08G 77/448* (2013.01); *C08K 3/20* (2013.01); *H05K 1/0353* (2013.01); *H05K 3/0014* (2013.01); *C08L 2201/02* (2013.01); *C08L 2207/04* (2013.01); *H05K 2201/0129* (2013.01); *Y10T 29/49119* (2015.01)

(58) Field of Classification Search
CPC .............................. C08G 77/448; C08L 69/00
See application file for complete search history.

(56) References Cited

U.S. PATENT DOCUMENTS

| | | | |
|---|---|---|---|
| 5,380,795 A | 1/1995 | Gosens et al. | |
| 7,985,788 B2 | 7/2011 | Shinagawa et al. | |
| 2003/0092805 A1* | 5/2003 | Seidel ................ | C08K 5/0066 524/127 |
| 2005/0064711 A1 | 3/2005 | Kliesch et al. | |
| 2005/0143520 A1* | 6/2005 | Saegusa ............... | C08F 283/12 525/100 |
| 2007/0184217 A1* | 8/2007 | Martin ..................... | B41M 5/52 428/32.1 |
| 2009/0292048 A1 | 11/2009 | Li et al. | |
| 2012/0083558 A1 | 4/2012 | Bayer et al. | |

FOREIGN PATENT DOCUMENTS

| | | |
|---|---|---|
| CN | 102770491 A | 11/2012 |
| DE | 198 28 536 A1 | 12/1999 |
| DE | 10 2006 012 990 A1 | 9/2007 |
| EP | 2 336 247 A1 | 6/2011 |
| EP | 2 291 290 B1 | 3/2012 |
| EP | 2 468 820 A1 | 6/2012 |
| WO | 2005 103113 A1 | 11/2005 |
| WO | 2009 024496 A2 | 2/2009 |
| WO | 2009 040772 A1 | 4/2009 |
| WO | 2011 010365 A1 | 1/2011 |
| WO | 2011076729 A1 | 6/2011 |
| WO | 2013 067678 A1 | 5/2013 |

OTHER PUBLICATIONS

Araujo et al. Materials Research 9(2) 181-184 (2006).*
English translation of Office Action from the Chinese Intellectual Property Office dated Sep. 26, 2016.

* cited by examiner

*Primary Examiner* — Kuo-Liang Peng
(74) *Attorney, Agent, or Firm* — Hudak, Shunk & Farine Co. LPA

(57) ABSTRACT

A thermoplastic composition including a) a1) a thermoplastic resin and a2) a silicon containing rubber and/or b) a polysiloxane-polycarbonate copolymer; and c) a metal (oxy) hydroxide with BET surface area of at least 10 as determined by DIN ISO 9277: 2010.

24 Claims, No Drawings

THERMOPLASTIC COMPOSITION

FIELD OF THE INVENTION

The present invention relates to an impact resistant, flame retardant thermoplastic composition and an article made from the composition. The invention also relates to use of the composition for a laser direct structuring process.

BACKGROUND OF THE INVENTION

An impact resistant, flame retardant thermoplastic composition is for example described in EP 2336247. EP 2336247 discloses a polycarbonate resin composition comprising at least a polycarbonate resin (A), a metal organic sulfonate (B), a fluoropolymer (C), a polyalkylsilsesquioxane particle having an average particle diameter of 0.6 to 5 micrometres (D), and a graft copolymer having a butadiene content of 50 percent or more (E). EP 2336247 mentions that the composition has an extremely high flame resistance and is also excellent in the impact resistance and the external appearance.

U.S. Pat. No. 7,985,788 discloses a flame retardant resin composition comprising a polyalkylene furan dicarboxylate, an aromatic polycarbonate, a phosphazene compound, a fluorine-containing compound and a silicone/acrylic core-shell rubber. U.S. Pat. No. 7,985,788 states that the composition is excellent in both impact resistance and flame retardancy.

WO 1110365 discloses an ignition resistant carbonate polymer composition consisting of: (i) an aromatic polycarbonate or an aromatic polyester carbonate, (ii) a non-silicon-containing graft (co)polymer produced by mass polymerization, (iii) a silicon-containing graft (co)polymer having a core-shell morphology, (iv) an oligomeric aromatic phosphorous compound, (v) a polytetrafluoroethylene polymer, a fluorothermoplast, or mixture thereof, and (vi) one or more of a thermoplastic vinyl (co)polymer, an impact modifier different from (iii), a filler, a reinforcing material, a stabilizer, a pigment, a dye, a mold release, a lubricant, or an anti-static agent. WO 1110365 states that the composition has excellent ignition resistance, in particular short burn time, and good mechanical properties and elevated heat resistance.

WO 09024496 discloses a polymer composition containing a) 30-97 mass percent of aromatic polycarbonate, b) 0.5-20 mass percent of a metal compound capable of being activated by electromagnetic radiation and thereby forming elemental metal nuclei, and c) 2.5-50 mass percent of at least one rubber-like polymer, wherein the sum of a)-c) is 100 percent. The rubber may be siloxane based rubbers. A polymer composition was provided which can be used for a laser direct structuring process and in which the degradation of the aromatic polycarbonate is reduced.

Although known compositions are satisfactory in certain situations, there is a constant need for a thermoplastic composition which shows a good flame retardancy and a good impact strength.

SUMMARY OF THE INVENTION

It is an object of the present invention to provide a thermoplastic composition which shows a good flame retardancy and a good impact strength.

This object is achieved in that the thermoplastic composition comprises:

a) a1) a thermoplastic resin and a2) a Si containing rubber and/or b) a polysiloxane-polycarbonate copolymer; and c) a metal (oxy)hydroxide with BET surface area of at least 10 as determined by DIN ISO 9277: 2010.

DETAILED DESCRIPTION OF THE INVENTION

The thermoplastic composition comprises components a) and c), b) and c) or a), b) and c).

It has surprisingly been found that the combination of the Si containing component and the metal (oxy)hydroxide, i.e., the combination of the components a2) and c) or b) and c) results in a good flame retardancy and a good impact strength.

Improvement of the impact strength of a thermoplastic composition generally results in a large decrease in the flame retardancy. Use of a Si component as an impact modifier results in a less decrease in the flame retardancy compared to the addition of other types of impact modifier such as the ones containing butadiene. Nevertheless, the composition with an improved impact strength by use of a Si component still leads to a decrease in the flame retardancy compared to a composition without a rubber.

Surprisingly, a high flame retardancy was obtained by the addition of the metal (oxy)hydroxide having BET surface area of at least 10 to a composition comprising a Si containing component as the impact modifier. The size of the metal (oxy)hydroxide was found to be an essential factor in achieving the improvement in the flame retardancy.

A good weathering/UV performance is also observed with the composition of the present invention.

It is noted that use of a metal hydroxide in a flame-retardant polycarbonate composition comprising a phosphorous-based flame retardant is described in EP 2468820. EP 2468820 mentions that the composition exhibits improved flameproofing properties along with good flowability. EP 2468820 however does not mention the BET surface area of the metal hydroxide.

The ratio of the total of a) and b) is preferably 75 to 99 wt % of with respect to the total composition. The ratio of a) with respect to the total of a) and b) may be 0-100 wt %, 1-99 wt %, 5-95 wt %, 10-90 wt %, 25-75 wt % or 40-60 wt %.

The ratio of the total of a1) and b) is preferably 75 to 99 wt % of with respect to the total composition. The ratio of a1) with respect to the total of a1) and b) may be 0-100 wt %, 1-99 wt %, 5-95 wt %, 10-90 wt %, 25-75 wt % or 40-60 wt %.

Properties

Preferably, a moulded part of the composition has a UL94 V2 rating, preferably V1 rating, more preferably V0 rating, at a thickness of 1.6 mm. More preferably, a moulded sample of the composition has a V2 rating, preferably V1 rating, more preferably V0 rating at a thickness of 0.8 mm.

UL94V is a method for evaluating the flame resistance from an afterflame time and drip property. The flame retardancy can be evaluated with a test piece having a prescribed size for the UL test kept in a temperature-controlled room.

The composition according to the present invention has a good hydrolytic stability. Preferably, the composition according to the present invention has a ratio between a second melt flow index (MFI) and a first melt flow index (MFI) of at most 3, preferably at most 2.5, more preferably 2.0, wherein the second melt flow index is a melt flow index (MFI) as measured according to ISO 1133 at a melt temperature of 300° C. and with a load of 1.2 kg after a hydrolytic exposure test in which the composition is placed in an autoclave at a temperature of 120° C., 100% Relative Humidity and 2 bar pressure for 50 hours and the composition is dried for 4 hours at 120° C. in a vacuum-N2 oven and the first melt flow index is a melt flow index (MFI) as measured according ISO 1133 at a melt temperature of 300° C. and with a load of 1.2 kg before the hydrolytic exposure test.

The composition according to the invention has a high impact strength, for example expressed in Izod Notched impact strength. Preferably, the Izod Notched impact strength at −20° C. (measured at a sample thickness of 3.2 mm according to ISO 180/4A) of a molded part of the thermoplastic composition has a value higher than 25 kJ/m$^2$. Preferably, the Izod Notched impact strength at room temperature (measured at a sample thickness of 3.2 mm according to ISO 180/4A) of a molded part of the thermoplastic composition has a value higher than 40 kJ/m$^2$.

Component a)

In some preferred embodiments, the thermoplastic composition comprises a1) a thermoplastic resin and a2) a Si containing rubber. The thermoplastic resin is used as the major component of the composition and the Si containing rubber is added as an impact modifier of the thermoplastic resin. The thermoplastic composition may or may not further comprise b) polysiloxane-polycarbonate copolymer.

The inventor has found that the addition of the Si containing rubber to the thermoplastic resin reduces the hydrolytic stability of the composition, but addition of component c) minimizes this hydrolytic degradation caused by addition of the Si containing rubber.

Component a1)

The concentration of a1) thermoplastic resin in the composition of the present invention is preferably between 50 wt % and 98 wt %, more preferably between 70 wt % and 97 wt %, with respect to the weight of the total composition.

Examples of thermoplastic resins that may be present in the composition according to the invention include, but are not limited to polycarbonate, in particular aromatic polycarbonate, polyamide, polyester, polyesteramide, polystyrene, polymethyl methacrylate or a combination of such resins. The resins may be homopolymers, copolymers or mixtures thereof, and may be branched or non-branched. It is to be understood that the a2) thermoplastic resin does not include a polysiloxane-polycarbonate.

Examples of suitable polyamides (PA) are aliphatic polyamides, that may eventually be branched polyamides, such as PA6, PA46, PA66, PA6/66, PA 11, PA12, semi aromatic polyamides as MXD6, PA6I/6T, PA66/6T, PA4T fully aromatic polyamides and copolymers and blends of the listed polyamides. Examples of suitable polyesters are polyethylene terephtalate (PET), polybutylene terephtalate (PBT), polypropylene terephtalate (PPT), polyethylene naphtanoate (PEN), polybutylene naphtanoate (PBN). Preferred polyesters are polyethylene terephtalate and polybutylene terephtalate.

In preferred embodiments, the thermoplastic resin comprises a polycarbonate-based resin. The polycarbonate-based resin may be selected from a polycarbonate or a resin blend that includes a polycarbonate. The polycarbonates may be homopolymers, copolymers and mixtures thereof, and may be branched or non-branched. Suitable polycarbonate-based resins are described e.g. in US2009/0292048, which is incorporated herein by reference.

Polycarbonates including aromatic carbonate chain units include compositions having structural units of the formula (I):

—R$^1$—O—CO—O— (I)

in which the R$^1$ groups are aromatic, aliphatic or alicyclic radicals. Beneficially, R$^1$ is an aromatic organic radical and, in an alternative embodiment, a radical of the formula (II):

-A$^1$-Y$^1$-A$^2$- (II)

wherein each of A$^1$ and A$^2$ is a monocyclic divalent aryl radical and Y$^1$ is a bridging radical having zero, one, or two atoms which separate A$^1$ from A$^2$. In an exemplary embodiment, one atom separates A$^1$ from A$^2$. Illustrative examples of radicals of this type are —O—, —S—, —S(O)—, —S(O2)-, —C(O)—, methylene, cyclohexyl-methylene, 2-[2,2,1]-bicycloheptylidene, ethylidene, isopropylidene, neopentylidene, cyclohexylidene, cyclopentadecylidene, cyclododecylidene, adamantylidene, or the like. In another embodiment, zero atoms separate A$^1$ from A$^2$, with an illustrative example being bisphenol. The bridging radical Y$^1$ can be a hydrocarbon group or a saturated hydrocarbon group such as methylene, cyclohexylidene or isopropylidene.

Suitable aromatic polycarbonates include polycarbonates made from at least a divalent phenol and a carbonate precursor, for example by means of the commonly known interfacial polymerization process or the melt polymersiation method. Suitable divalent phenols that may be applied are compounds having one or more aromatic rings that contain two hydroxy groups, each of which is directly linked to a carbon atom forming part of an aromatic ring. Examples of such compounds are: 4,4'-dihydroxybiphenyl, 2,2-bis(4-hydroxyphenyl)propane (bisphenol A), 2,2-bis(4-hydroxy-3-methylphenyl)propane, 2,2-bis-(3-chloro-4-hydroxyphenyl)-propane, 2,2-bis-(3,5-dimethyl-4-hydroxyphenyl)-propane, 2,4-bis-(4-hydroxyphenyl)-2-methylbutane, 2,4-bis-(3,5-dimethyl-4-hydroxyphenyl)-2-methylbutane, 4,4-bis(4-hydroxyphenyl)heptane, bis-(3,5-dimethyl-4-hydroxyphenyl)-methane, 1,1-bis-(4-hydroxyphenyl)-cyclohexane, 1,1-bis-(3,5-dimethyl-4-hydroxyphenyl)-cyclohexane, 2,2-(3,5,3',5'-tetrachloro-4,4'-dihydroxydiphenyl)propane, 2,2-(3,5,3',5'-tetrabromo-4,4'-dihydroxydiphenyl)propane, (3,3'-dichloro-4,4'-dihydroxyphenyl)methane, bis-(3,5-dimethyl-4-hydroxyphenyl)-sulphon, bis-4-hydroxyphenylsulphon, bis-4-hydroxyphenylsulphide.

The carbonate precursor may be a carbonyl halogenide, a halogen formate or carbonate ester. Examples of carbonyl halogenides are carbonyl chloride and carbonyl bromide. Examples of suitable halogen formates are bis-halogen formates of divalent phenols such as hydroquinone or of glycols such as ethylene glycol. Examples of suitable carbonate esters are diphenyl carbonate, di(chlorophenyl)carbonate, di(bromophenyl)carbonate, di(alkylphenyl)carbonate, phenyltolylcarbonate and the like and mixtures thereof. Although other carbonate precursors may also be used, it is preferred to use the carbonyl halogenides and in particular carbonylchloride, also known as phosgene.

The aromatic polycarbonates in the composition according to the invention may be prepared using a catalyst, an acid acceptor and a compound for controlling the molecular mass.

Examples of catalysts are tertiary amines such as triethylamine, tripropylamine and N,N-dimethylaniline, quaternary ammonium compounds such as tetraethylammoniumbromide and quaternary phosphonium compounds such as methyltriphenylfosfoniumbromide.

Examples of organic acid acceptors are pyridine, triethylamine, dimethylaniline and so forth. Examples of inorganic acid acceptors are hydroxides, carbonates, bicarbonates and phosphates of an alkali metal or earth alkali metal.

Examples of compounds for controlling the molecular mass are monovalent phenols such as phenol, p-alkylphenols and para-bromophenol and secondary amines.

Component a2)

Component a2) is preferably a graft copolymer comprising an elastomeric component containing Si. The graft copolymer is formed by graft-copolymerizing an elastomeric component containing Si with a monomer component copolymerizable therewith. The elastomeric component generally has a glass transition temperature of at most 0° C., preferably at most −20° C., more preferably−30° C.

As the graft copolymer for use in the invention, core/shell type graft copolymers are preferable wherein the core is the elastomeric component containing Si. The elastomeric component containing Si is preferably polyorganosiloxane.

Component a2) is preferably a polyorganosiloxane containing graft copolymer preferably prepared by polymerizing 5 to 60 parts by weight of a vinyl monomer (I) in the presence of 40 to 95 parts by weight of polyorganosiloxanes particles (II) (the sum of (I) and (II) is 100 parts by weight), as for example described in US2005/0143520. Examples of the vinyl monomers (I) include, for example, aromatic vinyl monomers such as styrene, alpha-methylstyrene, p-methylstyrene, and p-butylstyrene; vinylcyanide monomers such as acrylonitrile and methacrylonitrile; (meth)acrylic acid ester monomers such as methyl acrylate, ethyl acrylate, propyl acrylate, butyl acrylate, 2-ethylhexyl acrylate, glycidyl acrylate, hydroxyethyl acrylate, hydroxybutyl acrylate, methyl methacrylate, ethyl methacrylate, butyl methacrylate, lauryl methacrylate, glycidyl methacrylate, and hydroxyethyl methacrylate; and carboxyl-group-containing vinyl monomers such as itaconic acid, (meth)acrylic acid, fumaric acid, and maleic acid. The vinyl monomer (a-I) may include a multifunctional monomer having at least two polymerizable unsaturated bonds per molecule, if necessary. Examples of the multifunctional monomers include allyl methacrylate, triallyl cyanurate, triallyl isocyanurate, diallyl phthalate, ethylene glycol dimethacrylate, 1,3-butylene glycol dimethacrylate, and divinylbenzene. The vinyl monomer (I) may be used alone or in combination. The polyorganosiloxane particles (II) are preferably prepared by emulsion polymerization of the constituent components. A normal seeded emulsion polymerization can be applied to the graft copolymerization and can be achieved by radical-polymerizing the vinyl monomer (I) in latex of the polyorganosiloxane particles (II).

These graft copolymers comprising polyorganosiloxane are commercially available, e.g. as Kane Ace MR01 and Kane Ace MR02 from Kaneka Company.

Other materials suitable as component a2) include Metablen S-2001, Metablen S-2200 and Metablen SX05 from Mitsubishi Rayon.

Preferably, the thermoplastic composition comprises 1-20 wt % of Si-containing rubber, preferably 2-15 wt %, more preferably 3-10 wt %. Preferably, the thermoplastic composition according to the present invention is substantially free of other types of rubber, especially rubbers comprising butadiene.

Component b):

The thermoplastic composition may comprise a polysiloxane-polycarbonate copolymer as the major component of the composition. Instead of the impact strength of a1) the thermoplastic resin being modified by a2) the Si containing rubber, the polysiloxane-polycarbonate copolymer has an improved impact strength by the presence of the polysiloxane block in the copolymer. Examples of the polysiloxane-polycarbonate copolymer are described e.g. in U.S. Pat. No. 5,380,795 and WO 09040772, which are incorporated herein as follows:

The polysiloxane (also referred to as "polydiorganosiloxane") blocks of the copolymer comprise repeating siloxane units (also referred to as "diorganosiloxane units") of formula (1):

wherein each occurrence of R is same or different, and is a $C_{1-13}$ monovalent organic radical. For example, R can independently be a $C_1$-$C_{13}$ alkyl group, $C_1$-$C_{13}$ alkoxy group, $C_2$-$C_{13}$ alkenyl group, $C_2$-$C_{13}$ alkenyloxy group, $C_3$-$C_6$ cycloalkyl group, $C_3$-$C_6$ cycloalkoxy group, $C_6$-$C_{14}$ aryl group, $C_6$-$C_{10}$ aryloxy group, $C_7$-$C_{13}$ arylalkyl group, $C_7$-$C_{13}$ arylalkoxy group, $C_7$-$C_{13}$ alkylaryl group, or $C_7$-$C_{13}$ alkylaryloxy group. The foregoing groups can be fully or partially halogenated with fluorine, chlorine, bromine, or iodine, or a combination thereof. Combinations of the foregoing R groups can be used in the same copolymer.

The value of E in formula (1) can vary widely depending on the type and relative amount of each component in the thermoplastic composition, the desired properties of the composition, and like considerations. Generally, E can have an average value of 2 to 1,000, specifically 2 to 500, and more specifically 5 to 100. In one embodiment, E has an average value of 10 to 75, and in still another embodiment, E has an average value of 20 to 60. Where E is of a lower value, e.g., less than 40, it can be desirable to use Si-containing rubber in combination, possibly in a higher amount. For example, the composition comprising the polysiloxane-polycarbonate copolymer can comprise a low amount of the thermoplastic resin and a high amount of the Si-containing rubber. Conversely, where E is of a higher value, e.g., greater than 40, it can be desirable that the composition comprising the polysiloxane-polycarbonate copolymer comprises a high amount of the thermoplastic resin and a low amount of the Si-containing rubber.

A combination of a first and a second (or more) polysiloxane-polycarbonate copolymer can be used, wherein the average value of E of the first copolymer is less than the average value of E of the second copolymer.

In one embodiment, the polydiorganosiloxane blocks are provided by repeating structural units of formula (2):

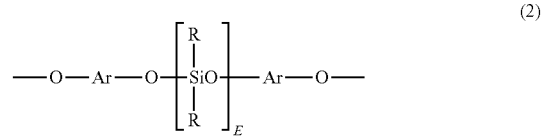

wherein E is as defined above; each R can independently be the same or different, and is as defined above; and each Ar can independently be the same or different, and is a substituted or unsubstituted $C_6$-$C_{30}$ arylene radical, wherein the bonds are directly connected to an aromatic moiety. Useful Ar groups in formula (2) can be derived from a $C_6$-$C_{30}$ dihydroxyarylene compound, for example a dihydroxyarylene compound. Combinations comprising at least one of the foregoing dihydroxyarylene compounds can also be used. Specific examples of dihydroxyarylene compounds are 1,1-bis(4-hydroxyphenyl) methane, 1,1-bis(4-hydroxyphenyl) ethane, 2,2-bis(4-hydroxyphenyl) propane, 2,2-bis(4-hydroxyphenyl) butane, 2,2-bis(4-hydroxyphenyl) octane, 1,1-bis(4-hydroxyphenyl) propane, 1,1-bis(4-hydroxyphenyl) n-butane, 2,2-bis(4-hydroxy-1-methylphenyl) propane, 1,1-bis(4-hydroxyphenyl)cyclohexane, bis(4-hydroxyphenyl sulphide), and 1,1-bis(4-hydroxy-t-butylphenyl) propane. Combinations comprising at least one of the foregoing dihydroxy compounds can also be used.

Units of formula (2) can be derived from the corresponding dihydroxy compound of formula (3):

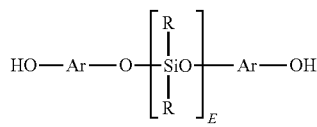

(3)

wherein R, Ar, and E are as described above. Compounds of formula (3) can be obtained by the reaction of a dihydroxyarylene compound with, for example, an alpha, omega-bisacetoxypolydiorangonosiloxane under phase transfer conditions.

In another embodiment, polydiorganosiloxane blocks comprise units of formula (4):

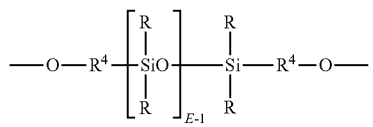

(4)

wherein R and E are as described above, and each occurrence of R is independently a divalent $C_1$-$C_{30}$ alkylene, and wherein the polymerized polysiloxane unit is the reaction residue of its corresponding dihydroxy compound. In a specific embodiment, the polydiorganosiloxane blocks are provided by repeating structural units of formula (5):

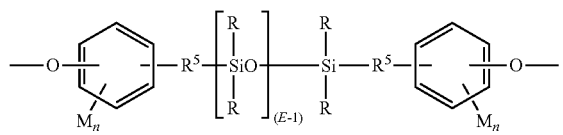

(5)

wherein R and E are as defined above. Each $R^5$ in formula (5) is independently a divalent $C_2$-$C_8$ aliphatic group. Each M in formula (5) can be the same or different, and can be a halogen, cyano, nitro, $C_1$-$C_8$ alkylthio, $C_1$-$C_8$ alkyl, $C_2$-$C_8$ alkoxy, $C_2$-$C_8$ alkenyl, $C_2$-$C_8$ alkenyloxy group, $C_3$-$C_8$ cycloalkyl, $C_3$-$C_8$ cycloalkoxy, $C_6$-$C_{10}$ aryl, $C_6$-$C_{10}$ aryloxy, $C_7$-$C_{12}$ arylalkyl, $C_7$-$C_{12}$ arylalkoxy, $C_7$-$C_{12}$ alkylaryl, or $C_7$-$C_{12}$ alkylaryloxy, wherein each n is independently 0, 1, 2, 3, or 4.

In one embodiment, M is bromo or chloro, an alkyl group such as methyl, ethyl, or propyl, an alkoxy group such as methoxy, ethoxy, or propoxy, or an aryl group such as phenyl, chlorophenyl, or tolyl; $R^5$ is a dimethylene, trimethylene or tetramethylene group; and R is a Ci_s alkyl, haloalkyl such as trifluoropropyl, cyanoalkyl, or aryl such as phenyl, chlorophenyl or tolyl. In another embodiment, R is methyl, or a mixture of methyl and trifluoropropyl, or a mixture of methyl and phenyl. In still another embodiment, M is methoxy, n is one, $R^5$ is a divalent $C_1$-$C_3$ aliphatic group, and R is methyl.

Units of formula (5) can be derived from the corresponding dihydroxy polydiorganosiloxane (6):

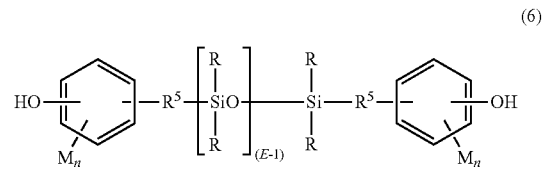

(6)

wherein R, E, M, $R^5$, and n are as described above. Such dihydroxy polysiloxanes can be made by effecting a platinum catalyzed addition between a siloxane hydride of formula (7):

(7)

wherein R and E are as previously defined, and an aliphatically unsaturated monohydric phenol. Useful aliphatically unsaturated monohydric phenols included, for example, eugenol, 2-allylphenol, 4-allyl-2-methylphenol, 4-allyl-2-phenylphenol, 4-allyl-2-bromophenol, A-allyl-2-t-butoxy-phenol, 4-phenyl-2-phenylphenol, 2-methyl-4-propylphenol, 2-allyl-4,6-dimethylphenol, 2-allyl-4-bromo-6-methylphenol, 2-allyl-6-methoxy-4-methylphenol and 2-allyl-4,6-dimethylphenol. Mixtures comprising at least one of the foregoing can also be used.

In an exemplary embodiment, the polysiloxane block is a poly(dimethyl siloxane) (PDMS) block.

The polysiloxane-polycarbonate can comprise 85 to 99 weight percent of carbonate units and 1 to 15 weight percent siloxane units. Within this range, the polysiloxane-polycarbonate copolymer can comprise 88, 90, 92, 94, 96, or 98 weight percent of carbonate units and correspondingly 2, 4, 6, 8, 10, or 12 weight percent of siloxane units. In a specific embodiment, the polysiloxane-polycarbonate comprises 85 to 98 weight percent of carbonate units and 2 to 15 weight percent siloxane units. In another specific embodiment, the polysiloxane-polycarbonate comprises 90 to 98 weight percent of carbonate units and 2 to 10 weight percent siloxane units.

In an embodiment, the polysiloxane-polycarbonate can comprise polysiloxane units, and carbonate units derived from bisphenol A. Polysiloxane-polycarbonates can have a weight average molecular weight of 2,000 to 100,000, specifically 5,000 to 50,000 as measured by gel permeation chromatography using a crosslinked styrene-divinyl benzene column, at a sample concentration of 1 milligram per milliliter, and as calibrated with polycarbonate standards.

The polysiloxane-polycarbonate can have a melt volume flow rate, measured at 300 degrees centigrade under a load of 1.2 kg, of 1 to 50 cubic centimeters per 10 minutes (cc/10 min), specifically 2 to 30 cc/10 min. Mixtures of polysiloxane-polycarbonates of different flow properties can be used to achieve the overall desired flow property. In an embodiment, exemplary polysiloxane-polycarbonates are marketed under the trade name LEXAN® EXL polycarbonates, available from Sabic Innovative Plastics.

In one embodiment, the thermoplastic composition comprises siloxane units of formula (1) in an amount of less than or equal to 2 weight percent, specifically 0.1 to 2 weight percent, more specifically 0.1 to 1.5 weight percent, and still more specifically 0.1 to 1.0 weight percent, based on the total weight of the thermoplastic composition.

Where E is of a lower value, e.g., less than 40, the weight ratio of the component (b) with respect to the total of the components (a1) and (b) may e.g. be at least 50% and may be 100%. For example, the composition may comprise (a1) 0-50 wt % of the thermoplastic resin, (a2) 1-20 wt % of the Si-containing rubber and (b) 50-99 wt % of the polysiloxane-polycarbonate copolymer.

Where E is of a lower value, e.g., less than 40, the weight ratio of the component (b) with respect to the total of the components (a1) and (b) may preferably be e.g. less than 50%. For example, the composition may comprise (a1) 50-98 wt % of the thermoplastic resin, (a2) 1-20 wt % of the Si-containing rubber and (b) 1-49 wt % of the polysiloxane-polycarbonate copolymer.

Component c)

The term metal (oxy)hydroxide is herein understood to mean both a metal hydroxide and a metal oxyhydroxide.

Preferably, the metal (oxy)hydroxide is a compound represented by the general formula $M_a(OH)_b$ or $M_aO(OH)_b$, wherein M is selected from the group consisting of Li, Na, K, Mg, Ca, Al, Zn and Fe and a is 1 or 2 and b is 1, 2 or 3. Preferably, M is Mg or Al. Most preferably, M is Al since the metal (oxy)hydroxides based on Al have high temperature stability.

Preferably, the metal (oxy)hydroxide is a metal oxyhydroxide represented by the general formula $M_aO(OH)_b$, wherein a is 1 or 2 and b is 1, 2 or 3. Preferably, a is 1 and b is 2.

Specific examples of the metal (oxy)hydroxide include $AlO(OH)$, $Al(OH)_3$, $Mg(OH)_2$, $Mg_2O(OH)_2$. Preferably, the metal oxyhydroxide is $AlO(OH)$, preferably $\gamma$-$AlO(OH)$.

The metal (oxy)hydroxide preferably has a BET surface area of at least 12, more preferably at least 15.

Preferably, the thermoplastic composition comprises 1-20 wt % of the metal (oxy)hydroxide, preferably 2-15 wt %, more preferably 3-10 wt %.

Particularly preferred examples of the thermoplastic composition of the present invention comprise a graft copolymer having a core/shell structure wherein the core comprises polyorganosiloxane as component a2) and AlO(OH) as component c).

Component d): Flame Retardant

The thermoplastic composition of the present invention may further comprise a flame retardant. The flame retardancy is further improved. Any known flame retardant may be used. Suitable examples of the flame retardant are certain alkali or earth alkali sulfonates (e.g. potassium perfluoro butane sulfonate), sulphonamide salts, perfluoroborates, halogenated compounds, especially bromated aromatic compounds, and phosphorus-bearing organic compounds, especially phosphate esters such as triphenyl phosphate and organic compounds containing phosphorus-nitrogen bonds.

Suitable phosphorus-bearing compounds are described in for example DE 19828535 A1 (Komponente E), in EP 0640655 A2 (Komponente D) and in EP 0363608 A1 (component C). As flame retarding compound use is preferably made of a phosphorous-based flame retardant, such as resorcinol diphenylphosphate (RDP), bisphenol-A diphenylphosphate (BDP), triphenyl phosphate or mixtures thereof. Phosphorous-based flame retardants are preferred, since the flame retardancy are significantly improved in combination with the metal hydroxide.

Preferably, the thermoplastic composition comprises 0-15 wt % of the d) flame retardant. Further suitable ranges of the amount of the flame retardant is 0.1-10 wt % or 1-5 wt %.

Component e): Coloring/LDS Enabling Additive

In some embodiments, the composition further comprises e) an additive selected from copper containing spinels such as copper chromium oxide spinel, copper molybdenum oxide spinel and copper chromium manganese oxide spinel; and tin containing oxides such as tin antimony oxide, tin bismuth oxide, tin aluminum oxide and tin molybdenum oxide.

These additives may function as e.g. a pigment. Additionally or alternatively, these additives may be used as a laser direct structuring (LDS) additive.

The term "laser direct structuring additive" or "LDS additive" is known and used e.g. in e.g. EP 2291290B1, US 2005064711, WO 2005103113 and WO 2009024496. In a laser direct structuring process, a thermoplastic composition comprising a thermoplastic resin and a laser direct structuring additive is provided and the thermoplastic composition is irradiated at areas on which conductive tracks are to be formed with laser radiation. Subsequently the irradiated areas are selectively metalized to form conductive tracks. No metallization occurs on the areas that are not irradiated with laser radiation. The metallization can be done e.g. by a standard electroless plating process, such as a copper plating process.

Without wanting to be bound by any theory, it is believed that the laser direct structuring additive may be capable of being activated by laser radiation and thereby form elemental metal particles. It is believed that these metal particles act as nuclei for copper deposition in a standard electroless copper plating process and form the basis for the formation of conductive tracks. It is also possible that the radiation is not directly absorbed by the laser direct structuring additive, but is absorbed by other substances which then transfer the absorbed energy to the laser direct structuring additive and thus bring about the liberation of elemental metal.

The laser radiation may be UV light (wavelength from 100 to 400 nm), visible light (wavelength from 400 to 800 nm), or infrared light (wavelength from 800 to 25 000 nm). Other preferred forms of radiation are X-rays, gamma rays, and particle beams (electron beams, $\alpha$-particle beams, and $\beta$-particle beams). The laser radiation is preferably infrared light radiation, more preferably with a wavelength of 1064 nm.

The additive may be copper containing spinels such as copper chromium oxide spinel, copper manganese oxide spinel and copper molybdenum oxide spinel. Copper containing spinels may function as a black pigment. Copper containing spinels may further function as a laser direct structuring (LDS) additive. Therefore, a composition is obtained having a good impact strength and a good flame retardancy and which can be used for an LDS process.

Accordingly, the present invention provides a thermoplastic composition comprising a) a1) a thermoplastic resin and a2) a Si containing rubber, c) a metal (oxy)hydroxide with BET surface area of at least 10 as determined by DIN ISO 9277: 2010 and e) copper containing spinel. The present invention further provides a thermoplastic composition comprising b) a polysiloxane-polycarbonate copolymer, c) a metal (oxy)hydroxide with BET surface area of at least 10 as determined by DIN ISO 9277: 2010 and e) copper containing spinel.

The additive may be tin containing oxide such as tin antimony oxide, tin bismuth oxide, tin aluminum oxide and tin molybdenum oxide. Tin containing oxides have varying colors from almost white to light grey and may function as a pigment for giving the corresponding color such as light grey. Tin containing oxide may further function as a laser direct structuring (LDS) additive. It was found that the combination of component b) and antimony tin oxide without component c) results in an even larger decrease in the flame retardancy and hydrolytic stability. Addition of component c) prevents this large decrease in the flame retardancy, resulting in a composition which can be used for an LDS process having a good impact strength, a good flame retardancy and a good hydrolytic stability.

Accordingly, the present invention provides a thermoplastic composition comprising a) a1) a thermoplastic resin and a2) a Si containing rubber, c) a metal (oxy)hydroxide with BET surface area of at least 10 as determined by DIN ISO 9277: 2010 and e) tin containing oxide. The present invention further provides a thermoplastic composition comprising b) a polysiloxane-polycarbonate copolymer, c) a metal (oxy)hydroxide with BET surface area of at least 10 as determined by DIN ISO 9277: 2010 and e) tin containing oxide.

Preferably, the additive e) has a small size for giving a good mechanical strength to the composition according to the present invention.

Preferably, the additive e) has a particle size D90 of at most 10 μm, more preferably at most 8 μm. Even more preferably, the metal oxide has a particle size D90 of at most 6 μm, more preferably at most 4 μm, more preferably at most 2.5 μm.

Preferably, the additive e) has a particle size D50 of at most 6 μm, more preferably at most 5 μm. Even more preferably, the additive e) has a particle size D50 of at most 3 μm, more preferably at most 1 μm.

The particle size may e.g. be determined by light scattering technology using a Microtrac full range analyzer (FRA) or a Malvern Mastersize particle size analyzer.

The concentration of the component e) present in the composition of the present invention is preferably between 0 wt % and 25 wt %, more preferably between 1 and 20 wt %, even more preferably between 3 wt % and 15 wt %, and particularly preferably from 5 wt % up to 10 wt %, with respect to the weight of the total composition.

Component f) White Pigment

In some embodiments, the composition further comprises a white pigment selected from $TiO_2$, $ZnO$ and $BaSO_4$. A white or a light colored thermoplastic composition can be thereby obtained. The white pigment is advantageous in that the pigments or dyes of other colors may be added to give a desired color to the composition, as long as their amounts do not interfere with the desired properties of the composition. Other pigments and dyes for giving the thermoplastic composition desired colours are known to the skilled person and are commercially available. Known pigments include metal oxides available from companies such as Ferro, The Shepherd Color Company, Heubach, Rockwood Pigments, Tomatec and Broll-Buntpigmente.

It was found that the combination of the impact modifier and $TiO_2$ results in an even larger decrease in the flame retardancy. Hence, it is more difficult to obtain a white or light colored composition with a good flame retardancy than a black or dark colored composition with a good flame retardancy. Addition of component c) prevents this large decrease in the flame retardancy, resulting in a composition of a desired color which has a good impact strength and a good flame retardancy.

Accordingly, the present invention provides a thermoplastic composition comprising a) a1) a thermoplastic resin and a2) a Si containing rubber, c) a metal (oxy)hydroxide with BET surface area of at least 10 as determined by DIN ISO 9277: 2010 and f) TiO2. The present invention further provides a thermoplastic composition comprising b) a polysiloxane-polycarbonate copolymer, c) a metal (oxy)hydroxide with BET surface area of at least 10 as determined by DIN ISO 9277: 2010 and f) TiO2. The present invention further provides a thermoplastic composition comprising a) a1) a thermoplastic resin and a2) a Si containing rubber, c) a metal (oxy)hydroxide with BET surface area of at least 10 as determined by DIN ISO 9277: 2010, e) an additive selected from copper containing spinels and tin containing oxides and f) TiO2. The present invention further provides a thermoplastic composition comprising b) a polysiloxane-polycarbonate copolymer, c) a metal (oxy)hydroxide with BET surface area of at least 10 as determined by DIN ISO 9277: 2010, e) an additive selected from copper containing spinels and tin containing oxides and f) TiO2.

The concentration of component f) present in the composition of the present invention is preferably between 0 wt % and 25 wt %, more preferably between 0.1 and 20 wt %, even more preferably between 0.5 wt % and 10 wt %, and particularly preferably from 1 wt % up to 5 wt %, with respect to the weight of the total composition.

Other Additives

The thermoplastic composition according to the invention may further comprise from 0 up to 25 wt % of one or more other additives, relative to the total weight of the composition. These include the customary additives such as stabilizers against thermal or thermo-oxidative degradation, stabilizers against hydrolytic degradation, stabilizers against degradation from light, in particular UV light, and/or photo-oxidative degradation, anti-drip agents such as for example PTFE, processing aids such as release agents and lubricants, colourants such as pigments and dyes. Suitable examples of such additives and their customary amounts are stated in the aforementioned Kunststoff Handbuch, 3/1.

Preferably, the total of a)-f) is at least 90 wt %, at least 95 wt %, at least 98 wt % or at least 99 wt % of the total composition. The total of a)-f) may be 100 wt % of the total composition.

In preferred embodiments, the composition of the present invention comprises:
a) a1) 50-98 wt % of a thermoplastic resin, a2) 1-20 wt % of a Si-containing rubber,
b) 0-48 wt % of a polysiloxane-polycarbonate copolymer,
c) 1-20 wt % of a metal (oxy)hydroxide,
d) 0-15 wt % of a flame retardant,
e) 0-25 wt % of an additive selected from copper containing spinels and tin containing oxides and
f) 0-25 wt % of a white pigment.

In further preferred embodiments, the composition of the present invention comprises:
a) a1) 0-49 wt % of a thermoplastic resin, a2) 0-20 wt % of a Si-containing rubber,
b) 50-99 wt % of a polysiloxane-polycarbonate copolymer, c) 1-20 wt % of a metal (oxy)hydroxide,
d) 0-15 wt % of a flame retardant,
e) 0-25 wt % of an additive selected from copper containing spinels and tin containing oxides and
f) 0-25 wt % of a white pigment.

In further preferred embodiments, the composition of the present invention comprises:
a) a1) 1-98 wt % of a thermoplastic resin, a2) 1-20 wt % of a Si-containing rubber,
b) 1-97 wt % of a polysiloxane-polycarbonate copolymer,
c) 1-20 wt % of a metal (oxy)hydroxide,
d) 0-15 wt % of a flame retardant,
e) 0-25 wt % of an additive selected from copper containing spinels and tin containing oxides and
f) 0-25 wt % of a white pigment.
wherein the total of a1) and b) is 50-99 wt % of the total composition.

In preferred embodiments, the composition of the present invention comprises:
a) a1) 50-97 wt % of a thermoplastic resin, a2) 1-20 wt % of a Si-containing rubber,
b) 0-47 wt % of a polysiloxane-polycarbonate copolymer,
c) 1-20 wt % of a metal (oxy)hydroxide,
d) 0-15 wt % of a flame retardant,
e) 1-25 wt % of an additive selected from copper containing spinels and tin containing oxides and
f) 0-25 wt % of a white pigment.

In further preferred embodiments, the composition of the present invention comprises:
a) a1) 0-48 wt % of a thermoplastic resin, a2) 0-20 wt % of a Si-containing rubber,
b) 50-98 wt % of a polysiloxane-polycarbonate copolymer,
c) 1-20 wt % of a metal (oxy)hydroxide,
d) 0-15 wt % of a flame retardant,
e) 1-25 wt % of an additive selected from copper containing spinels and tin containing oxides and
f) 0-25 wt % of a white pigment.

In further preferred embodiments, the composition of the present invention comprises:
a) a1) 1-97 wt % of a thermoplastic resin, a2) 1-20 wt % of a Si-containing rubber,
b) 1-96 wt % of a polysiloxane-polycarbonate copolymer,
c) 1-20 wt % of a metal (oxy)hydroxide,
d) 0-15 wt % of a flame retardant,
e) 1-25 wt % of an additive selected from copper containing spinels and tin containing oxides and
f) 0-25 wt % of a white pigment.
wherein the total of a1) and b) is 50-97 wt % of the total composition.

In preferred embodiments, the composition of the present invention comprises:
a) a1) 50-97 wt % of a thermoplastic resin, a2) 1-20 wt % of a Si-containing rubber,
b) 0-47 wt % of a polysiloxane-polycarbonate copolymer,
c) 1-20 wt % of a metal (oxy)hydroxide,
d) 0-15 wt % of a flame retardant,
e) 0-25 wt % of an additive selected from copper containing spinels and tin containing oxides and
f) 1-25 wt % of a white pigment.

In further preferred embodiments, the composition of the present invention comprises:
a) a1) 0-48 wt % of a thermoplastic resin, a2) 0-20 wt % of a Si-containing rubber,
b) 50-98 wt % of a polysiloxane-polycarbonate copolymer,
c) 1-20 wt % of a metal (oxy)hydroxide,
d) 0-15 wt % of a flame retardant,
e) 0-25 wt % of an additive selected from copper containing spinels and tin containing oxides and
f) 1-25 wt % of a white pigment.

In further preferred embodiments, the composition of the present invention comprises:
a) a1) 1-97 wt % of a thermoplastic resin, a2) 1-20 wt % of a Si-containing rubber,
b) 1-96 wt % of a polysiloxane-polycarbonate copolymer,
c) 1-20 wt % of a metal (oxy)hydroxide,
d) 0-15 wt % of a flame retardant,
e) 0-25 wt % of an additive selected from copper containing spinels and tin containing oxides and
f) 1-25 wt % of a white pigment,
wherein the total of a1) and b) is 50-97 wt % of the total composition.

In preferred embodiments, the composition of the present invention comprises:
a) a1) 50-96 wt % of a thermoplastic resin, a2) 1-20 wt % of a Si-containing rubber,
c) 1-20 wt % of a metal (oxy)hydroxide,
d) 0-15 wt % of a flame retardant,
e) 1-25 wt % of an additive selected from copper containing spinels and tin containing oxides and
f) 1-25 wt % of a white pigment.

In further preferred embodiments, the composition of the present invention comprises:
a) a1) 0-47 wt % of a thermoplastic resin, a2) 0-20 wt % of a Si-containing rubber,
b) 50-97 wt % of a polysiloxane-polycarbonate copolymer,
c) 1-20 wt % of a metal (oxy)hydroxide,
d) 0-15 wt % of a flame retardant,
e) 1-25 wt % of an additive selected from copper containing spinels and tin containing oxides and
f) 1-25 wt % of a white pigment.

In further preferred embodiments, the composition of the present invention comprises:
a) a1) 1-96 wt % of a thermoplastic resin, a2) 1-20 wt % of a Si-containing rubber,
b) 1-95 wt % of a polysiloxane-polycarbonate copolymer,
c) 1-20 wt % of a metal (oxy)hydroxide,
d) 0-15 wt % of a flame retardant,
e) 1-25 wt % of an additive selected from copper containing spinels and tin containing oxides and
f) 1-25 wt % of a white pigment.
wherein the total of a1) and b) is 50-96 wt % of the total composition.

It is to be understood that the description herein discloses the various compositions mentioned above wherein the amount of each of the components is at a range described as preferred in sections describing details of each of the components.

The components a)-f) and other additives as described above may be mixed by means of suitable mixing devices such as single-screw or twin-screw extruders, preferably a twin-screw extruder is used. The invention therefore further relates to a process for producing a thermoplastic composition according to the present invention by melt mixing components a)-c) and other components.

The invention further relates to moulded parts that contain the thermoplastic composition according to the present invention. The invention relates in particular to a moulded part produced by injection moulding of the composition according to the invention.

Examples of the molded articles include parts of electric/electronic devices, OA devices and information terminal devices, machine parts, household electrical appliances, vehicle parts, building members, various vessels, leisure supplies/sundries, lighting devices, gauges, etc. Of those, in particular, the molded articles are favorably used for parts of electric/electronic devices, OA devices, information terminal devices, household electrical appliances, lighting devices, etc., and are particularly favorably used for parts of electric/electronic devices.

Examples of the electric/electronic devices include personal computers, game machines, display devices such as televisions, printers, copiers, scanners, faxes, electronic notebooks and PDA, electronic desk calculators, electronic dictionaries, cameras, video cameras, mobile phones, battery packs, driving devices and reading devices of a recording medium, mouses, numeric keypads, CD players, MD players, portable radios/audio players, etc.

The molded articles may be produced by any known methods. Examples thereof include an injection molding method, an ultrahigh-speed injection molding method, an injection compression molding method, a two-color molding method, a hollow molding method such as gas-assisted molding, a molding method using an insulated mold, a molding method using a rapid heating mold, a foam molding (including a supercritical fluid, too), an insert molding, an IMC (in-mold coating) molding method, an extrusion molding method, a sheet molding method, a heat molding method, a rotation molding method, a laminate molding method, a press molding method, etc. A molding method using a hot runner system can also be employed.

The invention further relates to an article, in particular a circuit carrier, that contains a moulded part produced from the composition according to the invention comprising a component which functions as an LDS additive as described above. In one embodiment, such a circuit carrier is used for producing an antenna.

The invention further relates to a process for producing such a circuit carrier which process comprises the steps of providing a moulded part that contains the thermoplastic composition according to the present invention, irradiating areas of said part on which conductive tracks are to be formed with laser radiation, and subsequently metallizing the irradiated areas. In a preferred embodiment, the laser irradiation is used to simultaneously release metal nuclei and effect ablation of the part while forming an adhesion-promoting surface. This provides a simple means to achieve excellent adhesive strength of the deposited metallic conductor tracks. The wavelength of the laser is advantageously 248 nm, 308 nm, 355 nm, 532 nm, 1064 nm or of even 10600 nm. The deposition of further metal onto the metal nuclei generated by laser radiation preferably takes place via plating processes. Said metallization is preferably performed by immersing the moulded part in at least one electroless plating bath to form electrically conductive pathways on the irradiated areas of the moulded part. Non-limiting examples of electroless plating processes are a copper plating process, gold plating process, nickel plating process, silver plating, zinc plating and tin plating.

A further aspect of the present invention relates to the thermoplastic composition for use in a laser direct structuring process.

The invention further relates to use of a metal (oxy) hydroxide with BET surface area of at least 10 as determined by DIN ISO 9277: 2010 in a thermoplastic composition comprising a thermoplastic resin and a Si-containing rubber for improving flame retardancy.

The invention further relates to use of a metal (oxy) hydroxide in a thermoplastic composition comprising a thermoplastic resin and a Si-containing rubber for improving hydrolytic stability. The invention further relates to use of a metal (oxy)hydroxide with BET surface area of at least 10 as determined by DIN ISO 9277: 2010 in a thermoplastic composition comprising a thermoplastic resin and a Si-containing rubber for improving hydrolytic stability.

Although the invention has been described in detail for purposes of illustration, it is understood that such detail is solely for that purpose and variations can be made therein by those skilled in the art without departing from the spirit and scope of the invention as defined in the claims.

It is further noted that the invention relates to all possible combinations of features described herein, preferred in particular are those combinations of features that are present in the claims. It is particularly noted that the invention relates to all possible combinations of the ranges of components described herein.

It is further noted that the term 'comprising' does not exclude the presence of other elements. However, it is also to be understood that a description on a product comprising certain components also discloses a product consisting of these components. Similarly, it is also to be understood that a description on a process comprising certain steps also discloses a process consisting of these steps.

The invention will now be elucidated with reference to the following examples and comparative experiments.

EXAMPLES

The compositions of Comparative Experiments CEx 1-11 and of the Examples Ex 1 to Ex 5 were prepared from the components as given in Table 1. Additionally, additives for processing and stabilization were added. These additives include Mold Release Agent (Loxiol P861/3.5, supplied by Cognis) and Heat Stabilizer (Irgafos 168, supplied by BASF).

TABLE 1

| Material | Type | Supplier |
|---|---|---|
| Polycarbonate (PC) | LVN (ISO 1628/4) = 47.5-52.5 ml/g | MEP |
| Si copolymer | Kane Ace MR-02 | Kaneka |
| AlOOH 1 | Actilox B60 | Nabaltec AG |
| AlOOH 2 | Actilox B60 HS1 | Nabaltec AG |
| AlOOH 3 | Actilox 200 SM | Nabaltec AG |
| AlOOH 4 | Actilox 200 HS1 | Nabaltec AG |
| Titanium White | Kronos 2233 (Titanium dioxide) | Kronos |
| Pigment Black 28 | Black 1G (copper chromium oxide spinel) | Shepherd |
| Cassiterite Grey | Stanostat CP5C (antimony tin oxide) | Keeling & Walker |
| Anti Drip | Teflon TE3875-N | Dupont |
| Flame Retardant | RM 65 (Potassium Perfluoro Butane Sulfonate) | Miteni |

Table 2 gives the specific properties of the metal hydroxide materials used. The BET of the metal hydroxide particles were measured according to DIN ISO 9277: 2010. The metal hydroxide materials indicated as AlOOH1 and AlOOH2 are similar materials except that AlOOH2 is provided with a surface coating, which did not influence the flame retardancy of the compositions of the examples. Similarly, the metal hydroxide materials indicated as AlOOH3 and AlOOH4 are similar materials except that AlOOH4 is provided with a surface coating, which did not influence the flame retardancy of the compositions of the examples.

The particle size distribution values (D10, D50 and D90) are values as obtained by the suppliers. According to supplier information a Malvern Mastersizer particle size analyser 2000 was used to measure the particle size distribution of materials AlOOH1-4.

TABLE 2

| Material (supplier information) | AlOOH 1 | AlOOH 2 | AlOOH 3 | AlOOH 4 |
|---|---|---|---|---|
| Specific Surface Area | | | | |
| BET [m²/g] according DIN ISO 9277 | 6 | 6 | 18 | 18 |
| Typical Particle Size | | | | |
| D10% [μm] | 0.4 | 0.4 | 0.2 | 0.2 |
| D50% [μm] | 0.9 | 0.9 | 0.35 | 0.35 |
| D90% [μm] | 1.7 | 1.7 | 0.6 | 0.6 |
| Other | | | | |
| Surface Coated (supplier proprietary type) | No | Yes | No | Yes |

All sample compositions were prepared according the amounts as given in Table 3 to 7. All amounts are in weight percentage. In each of the experiments, samples were extruded on a co-rotating twin screw extruder at a temperature of 280° C. The extrudate was granulated and the collected granulate was dried for 4 hours at a temperature of 110° C. and subsequently injection moulded into UL test bars of 127*12.7*1.6 mm, using a melt temperature of approximately 290° C.-300° C.

Flame retardancy was measured according to UL 94 testing method.

Hydrolytic stability of the compounds was judged by measuring the Melt Flow Index (MFI) of the granulate material before and after a hydrolytic exposure test (HT) of the material in an autoclave operated at a temperature of 120° C., 100% Relative Humidity and 2 bar pressure for 50 hours. MFI was measured according ISO 1133 at a melt temperature of 300° C. and with a load of 1.2 kg. Before MFI testing the granulate was dried for 4 hours at 120° C. in a vacuum-N2 oven.

Examples 1-5 and Comparative Experiments 1-7

In Table 3, CEx1, CEx2, CEx3, Ex1 and Ex2 show the effect of AlOOH in a PC composition comprising a Si rubber, titanium dioxide and ATO. Comparison of CEx1 and CEx2 and CEx3 shows that the large sized AlOOH does not improve the flame retardancy of the composition, whereas comparison of CEx1 and Ex1 and Ex2 shows that the small sized AlOOH significantly improves the flame retardancy of the composition. It can also be seen that the difference in the AlOOH grade leads to substantially no difference in the flame retardancy. Comparison of CEx 1 and CEx 2, CEx 3, Ex 1 and Ex 2 shows that the hydrolytic stability of the composition without AlOOH is significantly improved by the addition of AlOOH. In CEx 1, the MFI increased 9 times after the hydrolytic exposure test, whereas in the experiments with AlOOH, the increase in the MFI was at most 2.2.

TABLE 3

| | | Sample | | | | |
|---|---|---|---|---|---|---|
| Components | Unit | CEx 1 | CEx 2 | CEx 3 | Ex 1 | Ex 2 |
| PC | % | 85.35 | 80.35 | 80.35 | 80.35 | 80.35 |
| Si rubber | % | 5 | 5 | 5 | 5 | 5 |
| AlOOH 1 | % | | 5 | | | |
| AlOOH 2 | % | | | 5 | | |
| AlOOH 3 | % | | | | 5 | |
| AlOOH 4 | % | | | | | 5 |
| Titanium White | % | 5 | 5 | 5 | 5 | 5 |
| Cassiterite Grey | % | 4 | 4 | 4 | 4 | 4 |
| Anti Drip | % | 0.3 | 0.3 | 0.3 | 0.3 | 0.3 |
| Other Additives | % | 0.35 | 0.35 | 0.35 | 0.35 | 0.35 |
| Total | % | 100 | 100 | 100 | 100 | 100 |
| FR Performance 1.6 mm | | | | | | |
| UL 94 (48 h-23° C.-50% RH) | — | NC | NC | NC | V-1 | V-1 |
| FOT (48 h-23° C.-50% RH) | s | 235 | 259 | 350 | 101 | 54 |
| UL 94 (168 h-70° C.) | — | NC | NC | NC | V-1 | V-1 |
| FOT (168 hrs-70° C.) | s | 276 | 325 | 349 | 88 | 64 |
| Hydrolytic Stability | | | | | | |
| MFI (300° C./1.2 kg) before HT | dg/min | 3.2 | 1.0 | 2.6 | 4.3 | 3.0 |
| MFI (300° C./1.2 kg) after HT | dg/min | 28.9 | 2.2 | 4.0 | 7.9 | 5.2 |

In Table 4, CEx4, CEx5, Ex 3 and Ex 4 show the effect of AlOOH in a PC composition comprising a Si rubber and titanium dioxide. Comparison of CEx4 and CEx5 shows that the large sized AlOOH does not improve the flame retardancy of the composition, whereas comparison of CEx4 and Ex3 and Ex4 shows that the small sized AlOOH significantly improves the flame retardancy of the composition. It can also be seen that the difference in the AlOOH grade leads to substantially no difference in the flame retardancy. Comparison of CEx 4 and CEx 5, Ex 3 and Ex 4 shows that the hydrolytic stability of the composition without AlOOH is significantly improved by the addition of AlOOH.

TABLE 4

| | Sample | | | | |
|---|---|---|---|---|---|
| Components | Unit | CEx 4 | CEx 5 | Ex 3 | Ex 4 |
| PC | % | 89.35 | 84.35 | 84.35 | 84.35 |
| Si rubber | % | 5 | 5 | 5 | 5 |

TABLE 4-continued

| Components | Unit | CEx 4 | CEx 5 | Ex 3 | Ex 4 |
|---|---|---|---|---|---|
| AlOOH 1 | % |  | 5 |  |  |
| AlOOH 3 | % |  |  | 5 |  |
| AlOOH 4 | % |  |  |  | 5 |
| Titanium White | % | 5 | 5 | 5 | 5 |
| Anti Drip | % | 0.3 | 0.3 | 0.3 | 0.3 |
| Other Additives | % | 0.35 | 0.35 | 0.35 | 0.35 |
| Total | % | 100 | 100 | 100 | 100 |
| FR Performance 1.6 mm |  |  |  |  |  |
| UL 94 (48 h-23° C.-50% RH) | — | NC | NC | V-1 | V-1 |
| FOT (48 h-23° C.-50% RH) | s | 318 | 267 | 60 | 50 |
| UL 94 (168 h-70° C.) | — | NC | NC | V-1 | V-1 |
| FOT (168 hrs-70° C.) | s | 207 | 224 | 52 | 27 |
| Hydrolytic Stability |  |  |  |  |  |
| MFI (300° C./1.2 kg) before HT | dg/min | 3.8 | 2.9 | 4.4 | 2.8 |
| MFI (300° C./1.2 kg) after HT | dg/min | 12.5 | 4.9 | 7.2 | 5.2 |

In Table 5, CEx6, CEx7 and Ex5 show the effect of AlOOH in a PC composition comprising a Si rubber and ATO. Comparison of CEx6 and CEx7 shows that the large sized AlOOH does not improve the flame retardancy of the composition, whereas comparison of CEx6 and Ex5 shows that the small sized AlOOH significantly improves the flame retardancy of the composition.

TABLE 5

| Components | Unit | CEx 6 | CEx 7 | Ex 5 |
|---|---|---|---|---|
| PC | % | 90.35 | 85.35 | 85.35 |
| Si rubber | % | 5 | 5 | 5 |
| AlOOH 1 | % |  | 5 |  |
| AlOOH 4 | % |  |  | 5 |
| Cassiterite Grey | % | 4 | 4 | 4 |
| Anti Drip | % | 0.3 | 0.3 | 0.3 |
| Other Additives | % | 0.35 | 0.35 | 0.35 |
| Total | % | 100 | 100 | 100 |
| FR Performance 1.6 mm |  |  |  |  |
| UL 94 (48 h-23° C.-50% RH) | — | NC | NC | V-1 |
| FOT (48 h-23° C.-50% RH) | s | 184 | 228 | 70 |

In Table 6, CEx8 and Ex6 show the effect of AlOOH in a PC composition comprising a Si rubber and $CuCr_2O_4$. Comparison of CEx8 and Ex 6 shows that the small sized AlOOH significantly improves the flame retardancy of the composition.

TABLE 6

| Components | Unit | CEx 8 | Ex 6 |
|---|---|---|---|
| PC | % | 86.35 | 81.35 |
| Si rubber | % | 5 | 5 |
| AlOOH 4 | % |  | 5 |
| Pigment Black 28 | % | 8 | 8 |

TABLE 6-continued

| Components | Unit | CEx 8 | Ex 6 |
|---|---|---|---|
| Anti Drip | % | 0.3 | 0.3 |
| Other Additives | % | 0.35 | 0.35 |
| Total | % | 100 | 100 |
| FR Performance 1.6 mm |  |  |  |
| UL 94 (48 h-23° C.-50% RH) | — | NC | V-1 |
| FOT (48 h-23° C.-50% RH) | s | 165 | 53 |

From Tables 3-6, the effect of AlOOH is clear in a PC composition comprising a Si-containing rubber irrespective of other additives.

Table 7 shows the effects of small sized AlOOH in a PC composition which does not comprise a Si-containing rubber. Comparison of CEx 9 and CEx 10 shows that the small sized AlOOH which improves the flame retardancy in the presence of Si containing rubber does not improve the flame retardancy of the composition. The synergistic effect of the combination of the Si-containing rubber and AlOOH is confirmed. Comparison of CEx 11 and CEx 12 shows that the AlOOH alone can even decrease the flame retardancy.

TABLE 7

| Components | Unit | CEx 9 | CEx 10 | CEx11 | CEx 12 |
|---|---|---|---|---|---|
| PC | % | 99.53 | 94.53 | 99.45 | 94.45 |
| AlOOH 4 | % |  | 5 |  | 5 |
| Flame Retardant | % | 0.12 | 0.12 |  |  |
| Anti Drip | % |  |  | 0.2 | 0.2 |
| Other Additives | % | 0.35 | 0.35 | 0.35 | 0.35 |
| Total | % | 100 | 100 | 100 | 100 |
| FR Performance 1.6 mm |  |  |  |  |  |
| UL 94 (48 h-23° C.-50% RH) | — | V-2 | V-2 | V-0 | V-2 |
| FOT (48 h-23° C.-50% RH) | s | 65 | 45 | 26 | 43 |
| UL 94 (168 h-70° C.) | — | V-2 | V-2 | V-0 | V-2 |
| FOT (168 hrs-70° C.) | s | 42 | 52 | 21 | 79 |

What is claimed is:

1. Thermoplastic composition comprising:
    a) a1) a thermoplastic resin and a2) a silicon containing rubber and/or
    b) a polysiloxane-polycarbonate copolymer; and
    c) a metal (oxy)hydroxide with BET surface area of at least 10 as determined by DIN ISO 9277: 2010,
    wherein a concentration of a1) the thermoplastic resin is between 50 wt % and 98 wt % with respect to the weight of the total composition,
    wherein a1) the thermoplastic resin comprises a non-branched polycarbonate and
    wherein a2) the silicon containing rubber is a graft copolymer having a core/shell structure wherein the core is an elastomeric component containing Si which is polyorganosiloxane,
    wherein the composition further comprises e) a metal oxide that is one or more of copper containing spinel and a tin containing oxide, wherein the tin containing oxide is one or more of tin antimony oxide, tin bismuth oxide, tin aluminum oxide and tin molybdenum oxide.

2. Thermoplastic composition according to claim 1, wherein c) the metal (oxy)hydroxide is a compound represented by a general formula $M_a(OH)_b$ or $M_aO(OH)_b$, wherein each M independently is Li, Na, K, Mg, Ca, Al, Zn or Fe, a is 1 or 2 and b is 1, 2 or 3.

3. Thermoplastic composition according to claim 2, wherein c) the metal (oxy)hydroxide is a AlO(OH) or y-AlO(OH).

4. Thermoplastic composition according to claim 3, wherein the composition further comprises d) a flame retardant that is one or more of an alkali or earth alkali sulfonate, sulphonamide salt, perfluoroborate, halogenated compound and phosphorus-bearing organic compound.

5. Thermoplastic composition according to claim 4, wherein the composition further comprises f) a white pigment that is one or more of $TiO_2$, ZnO and $BaSO_4$.

6. Thermoplastic composition according to claim 5, wherein the thermoplastic composition comprises
   a) a1) 50-98 wt % of the thermoplastic resin and a2) 1-20 wt % of the silicon containing rubber,
   b) 0-48% of the polysiloxane-polycarbonate copolymer,
   c) 1-20 wt % of the metal (oxy)hydroxide,
   d) 0-15 wt % of a flame retardant,
   e) 1-25 wt % of the metal oxide and
   f) 0-25 wt % of a white pigment that is one or more of $TiO_2$, ZnO and $BaSO_4$.

7. Thermoplastic composition according to claim 6, wherein a moulded part of the composition has a UL94 V2 rating at a thickness of 1.6 mm.

8. A moulded part that contains the thermoplastic composition according to claim 7.

9. Thermoplastic composition according to claim 7, wherein the moulded part of the composition has a UL94 V0 rating, at a thickness of 1.6 mm.

10. Thermoplastic composition according to claim 4, wherein the copper containing spinel is one or more of copper chromium oxide spinel, copper molybdenum oxide spinel and copper chromium manganese oxide spinel.

11. Thermoplastic composition according to claim 2, wherein c) the metal (oxy)hydroxide is a metal oxyhydroxide represented by the general formula $M_aO(OH)_b$.

12. Thermoplastic composition according to claim 1, wherein the composition further comprises d) a flame retardant that is one or more of an alkali or earth alkali sulfonate, sulphonamide salt, perfluoroborate, halogenated compound and phosphorus-bearing organic compound.

13. Thermoplastic composition according to claim 1, wherein the composition further comprises f) a white pigment that is one or more of $TiO_2$, ZnO and $BaSO_4$.

14. Thermoplastic composition according to claim 1, wherein the thermoplastic composition comprises
   a) a1) 50-98 wt % of the thermoplastic resin and a2) 1-20 wt % of the silicon containing rubber,
   b) 0-48% of the polysiloxane-polycarbonate copolymer,
   c) 1-20 wt % of the metal (oxy)hydroxide,
   d) 0-15 wt % of a flame retardant,
   e) 1-25 wt % of the metal oxide and
   f) 0-25 wt % of a white pigment that is one or more of $TiO_2$, ZnO and $BaSO_4$.

15. Thermoplastic composition according to claim 1, wherein a moulded part of the composition has a UL94 V2 rating at a thickness of 1.6 mm.

16. Thermoplastic composition according to claim 15, wherein the moulded part of the composition has a UL94 V1 rating, at a thickness of 1.6 mm.

17. Thermoplastic composition according to claim 16, wherein the moulded part of the composition has a UL94 V0 rating, at a thickness of 1.6 mm.

18. Thermoplastic composition according to claim 1, wherein a2) the silicon containing rubber is a polyorganosiloxane containing graft copolymer prepared by polymerizing 5 to 60 parts by weight of a vinyl monomer (I) in the presence of 40 to 95 parts by weight of polyorganosiloxanes particles (II), wherein a sum of (I) and (II) is 100 parts by weight.

19. A moulded part that contains the thermoplastic composition according to claim 1.

20. Thermoplastic composition according to claim 1, wherein the copper containing spinel is one or more of copper chromium oxide spinel, copper molybdenum oxide spinel and copper chromium manganese oxide spine.

21. The thermoplastic composition according to claim 1, wherein the composition further comprises TiO2.

22. A process for producing a circuit carrier, comprising the steps of: providing:
   a moulded part that contains a thermoplastic composition comprising:
   a) a1) a thermoplastic resin and a2) a silicon containing rubber and/or
   b) a polysiloxane-polycarbonate copolymer; and
   c) a metal (oxy)hydroxide with BET surface area of at least 10 as determined by DIN ISO 9277: 2010,
   wherein a concentration of a1) the thermoplastic resin is between 50 wt % and 98 wt % with respect to the weight of the total composition,
   wherein a1) the thermoplastic resin comprises a non-branched polycarbonate and wherein a2) the silicon containing rubber is a graft copolymer having a core/shell structure wherein the core is an elastomeric component containing Si which is polyorganosiloxane, wherein the thermoplastic composition comprises e) 1-25 wt % of one or more of a copper containing spinel and a tin containing oxide;
   irradiating areas of said part on which conductive tracks are to be formed with laser radiation; and
   subsequently metalizing the irradiated areas.

23. A circuit carrier obtained by the process according to claim 22.

24. The process according to claim 22, wherein the copper containing spinel is one or more of copper chromium oxide spinel, copper molybdenum oxide spinel and copper chromium manganese oxide spinel; and wherein the tin containing oxide is one or more of tin antimony oxide, tin bismuth oxide, tin aluminum oxide and tin molybdenum oxide.

* * * * *